United States Patent
Kato et al.

(10) Patent No.: US 7,102,869 B2
(45) Date of Patent: Sep. 5, 2006

(54) OPTICAL SEMICONDUCTOR RELAY

(75) Inventors: Toshimitsu Kato, Fukuoka-ken (JP);
Masaru Yumura, Fukuoka-ken (JP);
Yoshiaki Aizawa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 453 days.

(21) Appl. No.: 10/661,367

(22) Filed: Sep. 12, 2003

(65) Prior Publication Data
US 2004/0124339 A1    Jul. 1, 2004

(30) Foreign Application Priority Data
Sep. 19, 2002  (JP) ............................. 2002-273500

(51) Int. Cl.
*H01H 47/24* (2006.01)
(52) U.S. Cl. ..................................... 361/173
(58) Field of Classification Search ................ 361/173
See application file for complete search history.

(56) References Cited

U.S. PATENT DOCUMENTS 4,777,387 A * 10/1988 Collins ........................ 327/109
4,931,656 A * 6/1990 Ehalt et al. .................. 250/551
5,013,926 A   5/1991 Aizawa

* cited by examiner

*Primary Examiner*—Ronald Leja
(74) *Attorney, Agent, or Firm*—Hogan & Hartson LLP

(57) ABSTRACT

An optical semiconductor relay comprises a light emitting element converting an electrical signal into an optical signal, a first photodiode array receiving the optical signal from the light emitting element. The first photodiode array converts the optical signal into an electrical signal. The relay is further provided with a first diode having one electrode connected to one end of the first photodiode array and a MOSFET. The MOSFET has a gate terminal connected to other electrode of the first diode, and a source terminal connected to other end of the first photodiode array. A second photodiode array is arranged to receive the optical signal from the light emitting element. The second photodiode array converts the optical signal into an electrical signal and has both ends connected to the respective electrodes of the first diode. A control circuit connected between the gate and source terminals of the MOSFET.

7 Claims, 2 Drawing Sheets

OPTICAL SEMICONDUCTOR RELAY

CROSS-REFERENCE TO RELATED APPLICATIONS

This application is based upon and claims the benefit of priority from the prior Japanese Patent Application No. 2002-273500, filed Sep. 19, 2002, the entire contents of which are incorporated herein by reference.

FIELD OF THE INVENTION

The present invention relates to an optical semiconductor relay, and more particularly, to an optical semiconductor relay designed to reduce switching time.

BACKGROUND OF THE INVENTION

An optical semiconductor relay is generally provided with an input light emitting element such as an LED (hereinafter, referred to as LED), an output photodiode array (hereinafter, referred to as PDA) and a switching MOSFET. The PDA receives input light from the LED and converts the light into a voltage. This voltage becomes a gate voltage of the switching MOSFET, and the optical semiconductor relay performs the switching by driving the MOSFET. Since electrical signals are converted into light to be transmitted, it is possible to insulate between the input and output electrically. At the same time, it is possible to drive a small-size optical semiconductor relay with low power consumption at high speed without contact wear, unlike a mechanical relay.

An optical semiconductor relay is disclosed in U.S. Pat. No. 5,013,926 (FIG. 4). FIG. 1 shows the circuit structure of such an optical semiconductor relay. As shown in the FIG. 1, an anode end of a first PDA 2 which receives light from an LED 1, a diode 5 and a gate terminal of a MOSFET 4 are connected in series. A cathode end of the first PDA 2 is connected to the source terminal of a MOSFET 4. The anode end of first PDA 2 is connected to a cathode end of a second PDA 3, and an anode end of second PDA 3 is connected to a cathode electrode of diode 5 through an impedance element 10. First PDA 2 and second PDA 3 have a plurality of photodiodes respectively the same polarities of which are connected in series. Connection area of the photodiodes constituting the second PDA 3 is smaller than those of first PDA 2. First PDA 2 and second PDA 3 are connected in series as a whole.

A normally-on transistor (hereinafter, referred to as J-FET 12) constituting a control circuit with impedance element 10 is connected as to enclose impedance element 10 by the gate and source terminals thereof. The control circuit controls speed and photosensitivity of the optical semiconductor relay by controlling charging and discharging time of the switching MOSFET constituting the optical semiconductor relay.

In this optical semiconductor relay, when an input electrical signal is turned on (ON-state), LED 1 emits light, and first PDA 2 received this light converts the light into an electrical signal. Current flows to the gate terminal of MOSFET 4 through diode 5, and the gate of MOSFET 4 is charged and shifted to an ON-state. Meanwhile, part of current converted at first PDA 2 is supplied to the gate terminal of J-FET 12 through impedance element 10. Second PDA 3 also receives the light from LED 1 and generates a current. This current is supplied to the gate terminal of J-FET 12 with the current converted at first PDA 2. A potential difference between both ends of impedance element 10 is applied between the gate and source of J-FET 12 as a bias voltage, J-FET 12 is shifted to an OFF-state.

When the input electrical signal is turned off (OFF-state), the optical signal is not output from LED 1, and the electrical signals from first PDA 2 and second PDA 3 is not output either. Accordingly, the current vanishes, and the bias voltage of J-FET 12 becomes 0 volt. Thus, J-FET 12 is shifted to an ON-state. When J-FET 12 shifts to an ON-state, it is short-circuited between the gate and the source of MOSFET 4. Therefore, a stored electric load is quickly discharged, and MOSFET 4 is shifted to an OFF-state.

SUMMARY OF THE INVENTION

An optical semiconductor relay according to an embodiment of the present invention comprises: a light emitting element converting an electrical signal into an optical signal; a first photodiode array receiving the optical signal from the light emitting element, the first photodiode array converting the optical signal into an electrical signal; a first diode having one electrode connected to one end of the first photodiode array; a MOSFET having a gate terminal connected to other electrode of the first diode, and a source terminal connected to other end of the first photodiode array; a second photodiode array receiving the optical signal from the light emitting element, the second photodiode array converting the optical signal into an electrical signal, and having both ends connected to the respective electrodes of the first diode; and a control circuit connected between the gate and source terminals of the MOSFET.

An optical semiconductor relay according to another embodiment of the present invention comprises: a light emitting element converting an electrical signal into an optical signal; a first photodiode array receiving the optical signal from the light emitting element, the first photodiode array converting the optical signal into an electrical signal; a first diode having one electrode connected to one end of the first photodiode array; a MOSFET having a gate terminal connected to other electrode of the first diode, and a source terminal connected to other end of the first photodiode array; a second photodiode array receiving the optical signal from the light emitting element, the second photodiode array converting the optical signal into an electrical signal, and having one end connected to one electrode of the first diode, and other end connected to other electrode of the first diode through an impedance element; a normally-on transistor having source and drain terminals connected to the gate and source terminals of the MOSFET, respectively, and a gate terminal connected to a connection point between the impedance and the second photodiode array; and a bypass diode connected to the impedance element in parallel.

DETAILED DESCRIPTION OF EMBODIMENTS

A first embodiment in accordance with the present invention will be explained with reference to FIG. 2 and FIG. 3.

Figure 1:
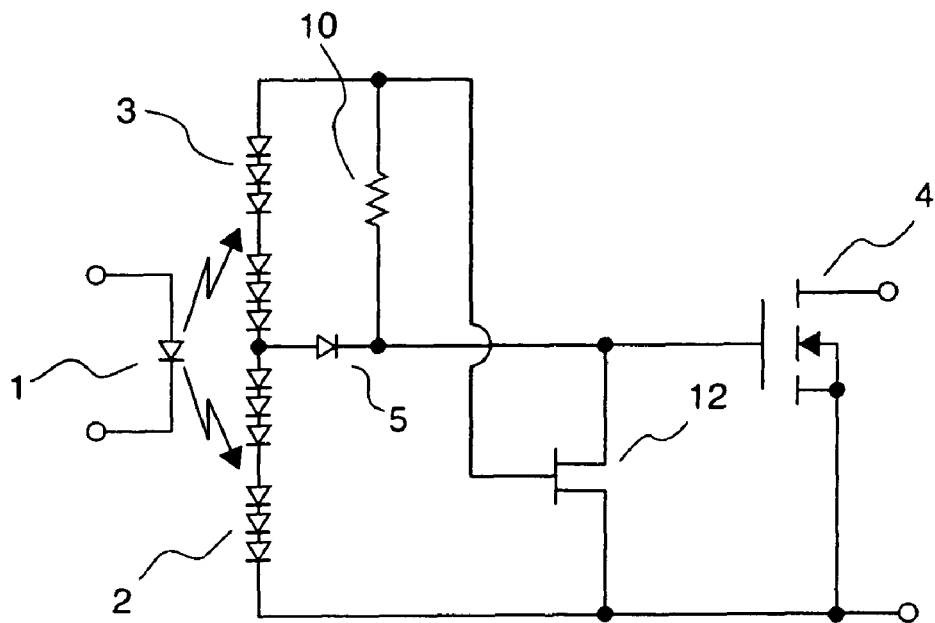
FIG. 1 is a view showing a circuit structure of a conventional optical semiconductor relay.
Figure 2:
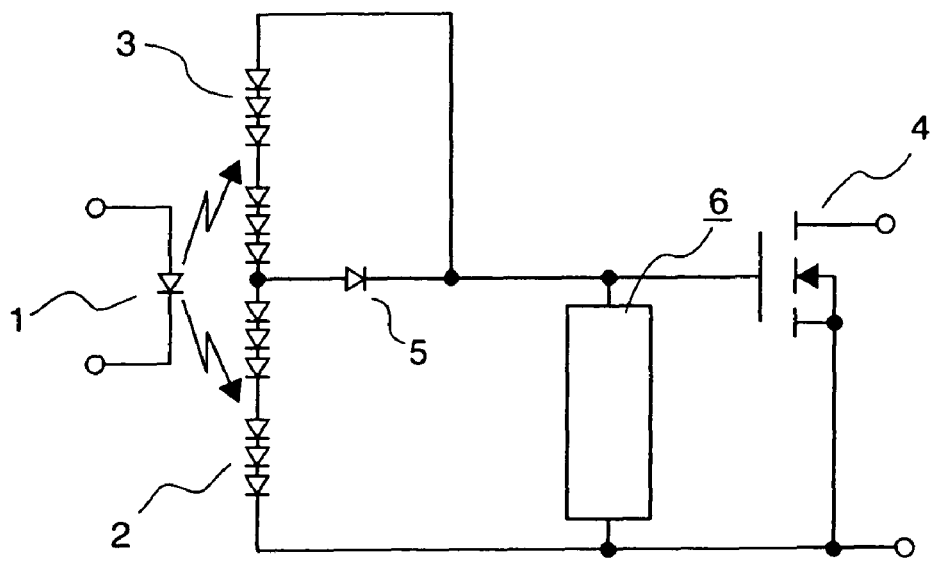
FIG. 2 is a view showing a circuit structure of an embodiment of an optical semiconductor relay of the present invention.

FIG. 2 is a circuit diagram of an embodiment of an optical semiconductor relay of the present invention. As shown in the FIG. 2, a first photodiode array (a first PDA 2) is provided to optically couple with a light emitting element (an LED 1). The light emitting element converts an electrical signal into an optical signal. The first photodiode array receives the optical signal from the light emitting element and converts the optical signal into a first electrical signal. A cathode end of first PDA 2 and a source terminal of a switching MOSFET 4 are connected. An anode end of first PDA 2 is connected to a gate terminal of MOSFET 4 through a first diode 5 in series. An anode electrode of diode 5 is connected to the anode end of first PDA 2, and a cathode electrode of diode 5 is connected to the gate terminal of MOSFET 4.

A second photodiode array (a second PDA 3) having a smaller connection area than that of first PDA 2 is provide to increase output voltage. A second photodiode array receives the optical signal from the light emitting element and converts the optical signal into a second electrical signal. An anode end of first PDA 3 is connected to the gate terminal of MOSFET 4 substantially without an impedance element, and a cathode end of second PDA 3 is connected to the anode end of first PDA 2. First PDA 2 and second PDA 3 are connected in series as a whole. The cathode end of second PDA 3 is connected to the anode end of first diode 5. The anode end of second PDA 3 is connected to the cathode end of first diode 5. A control circuit 6 is connected between the gate and source terminals of MOSFET 4.

Figure 3:
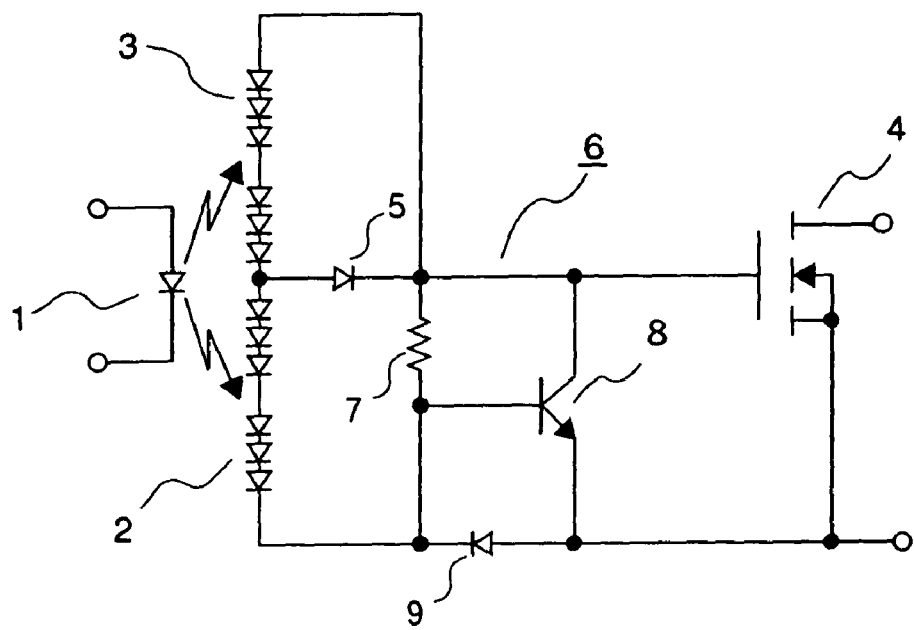
FIG. 3 is a view showing a specific circuit structure of FIG. 2.

FIG. 3 shows a specific circuit structure of the optical semiconductor relay, including the structure of control circuit 6. An impedance element 7 (e.g., resistor), an NPN transistor 8 and a second diode 9 constitute control circuit 6. Impedance element 7 is connected between the gate and source terminals of MOSFET 4 and the cathode terminal of first PDA 2. A base and collector terminals of NPN transistor 8 are connected to both ends of impedance element 7, respectively. Diode 9 is connected between an emitter and base terminals of NPN transistor 8. An anode electrode of diode 9 is connected is connected to the emitter terminal of NPN transistor 8.

According to this circuit structure, when a signal is inputted, a current produced by first PDA 2 flows from first PDA 2 to the gate of MOSFET 4 through diode 5, and a current produced by second PDA 3 flows from second PDA 3 to the gate of MOSFET 4. Thus, the gate of MOSFET 4 is shifted to an ON-state. In these paths, charging resistance becomes extremely small since an impedance element does not exist substantially. Thus, MOSFET 4 is turned on swiftly.

When a signal is inputted, NPN transistor 8 constituting control circuit 6 is turned off because a current flowing from the anode of the diode 9 to the cathode thereof makes a voltage between the base and emitter reversely biased. On the other hand, when a signal is not inputted, an electric charge stored in the gate of MOSFET 4 is discharged to the base terminal of NPN transistor 8 through impedance element 7. The electric charge becomes a base current. Thus, NPN transistor 8 is shifted to an ON-state.

By employing control circuit 6, the impedance element is not connected in series with respect to the charging current of MOSFET 4. Accordingly, control circuit 6 does not act as charging resistance, and the switch-on time of the optical semiconductor relay can be reduced. At the same time, NPN transistor 8 and diode 9 can be formed in a space which is one-tenth or less of the space required for the normally-on transistor (hereinafter, J-FET: junction FET transistor). Thus, it is possible to shrink chips and reduce manufacturing costs.

A second embodiment in accordance with the present invention will be explained with reference to FIG. 4.

Figure 4:
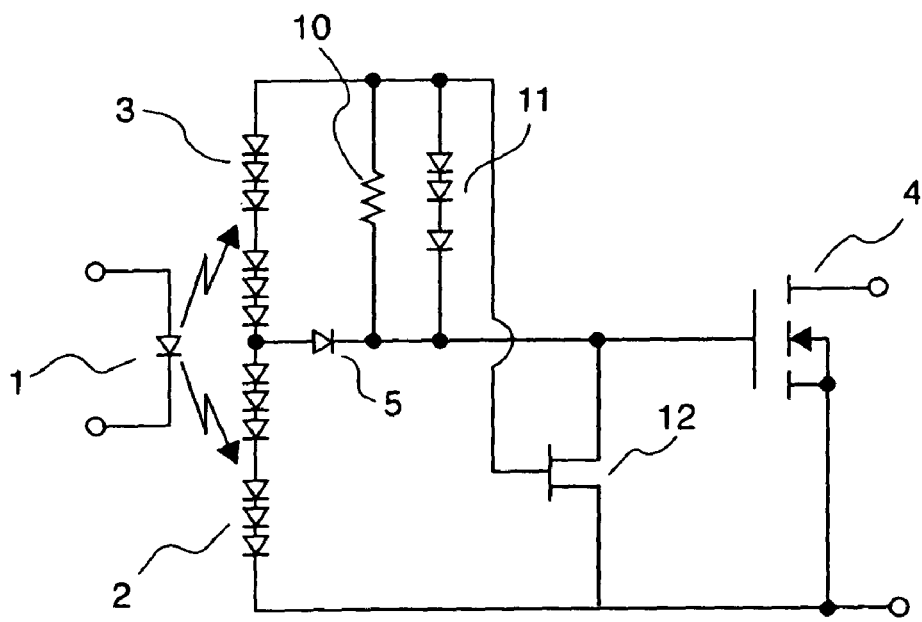
FIG. 4 is a view showing a circuit structure of another embodiment of an optical semiconductor relay of the present invention.

FIG. 4 is a circuit structure of another embodiment of an optical semiconductor relay of the present invention.

As shown in the drawing, an anode end of a first PDA 2 which receives light from an LED 1, a diode 5 and a gate terminal of a MOSFET 4 are connected in series, and a cathode end of the first PDA 2 is connected to the source terminal of a MOSFET 4. The anode end of first PDA 2 is connected to a cathode end of a second PDA 3, and an anode end of second PDA 3 is connected to a cathode electrode of diode 5 through an impedance element 10 (e.g., resistor). First PDA 2 and second PDA 3 are a plurality of photodiodes of which the same polarities are connected in series. Connection area of the photodiodes constituting the second PDA 3 is smaller than those of first PDA 2. First PDA 2 and second PDA 3 are connected in series as a whole.

A normally-on transistor (hereinafter, referred to as J-FET 12) constituting a control circuit with impedance element 10 is connected as to enclose impedance element 10 by the gate and source terminals thereof. The control circuit controls speed and photosensitivity of the optical semiconductor relay by controlling charging and discharging time of the switching MOSFET constituting the optical semiconductor relay. A plurality of serially connected diode elements (hereinafter, referred to as bypass diode 11) are connected to impedance element 10 in parallel.

A transistor which turns off at 1 to 2 volts is usually employed for J-FET 12. When a potential difference between both ends of impedance element 10 exceeds 2 volts and J-FET 12 is turned off, bypass diode 11 is operated. Consequently, serial impedance of second PDA 3, serving as charging resistance, is reduced, and the switch-on time of the optical semiconductor relay is shortened.

The conventional optical semiconductor relay has had a problem that a charging time is delayed, in other words, a switch-on time is increased. It is because an impedance element acts as charging resistance since the impedance element constituting a control circuit is connected in series with respect to a charging current flowing from a second PDA to a MOSFET.

According to the embodiments of the present invention, it is possible to provide an optical semiconductor relay capable of shortening the switch-on time without degrading the operation functions, and shrinking chips and reducing manufacturing costs.

The present invention is not limited to the embodiments described above. For example, a PNP transistor may be employed instead of NPN transistor 8 shown in FIG. 3. An infinitesimal impedance for adjusting switching time or photosensitivity may be inserted between second PDA 3 and MOSFET 4.

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the following.

What is claimed is:

1. An optical semiconductor relay comprising:
   a light emitting element converting an electrical signal into an optical signal;
   a first photodiode array receiving the optical signal from the light emitting element, the first photodiode array converting the optical signal into an electrical signal;
   a first diode having one electrode connected to one end of the first photodiode array;
   a MOSFET having a gate terminal connected to other electrode of the first diode, and a source terminal connected to other end of the first photodiode array;
   a second photodiode array receiving the optical signal from the light emitting element, the second photodiode array converting the optical signal into an electrical signal, and having both ends connected to the respective electrodes of the first diode; and
   a control circuit including an impedance element connected between the gate and source terminals of the MOSFET, a bipolar transistor having base and collector terminals connected to both terminals of the impedance element, respectively, and a second diode connected between an emitter and base terminals of the bipolar transistor,
   wherein an anode of the second diode is connected to the emitter terminal of the bipolar transistor and the source terminal of the MOSFET, and a cathode of the second diode is connected to a cathode end of the first photodiode array.

2. The optical semiconductor relay according to claim 1, wherein a plurality of photodiodes of a same polarity are connected in series in each of the first and second photodiode arrays, and the photodiodes constituting the first photodiode array has connection areas larger than those of the photodiodes constituting the second photodiode array.

3. The optical semiconductor relay according to claim 2, wherein an anode electrode of the first diode is connected to an anode end of the first photodiode array.

4. The optical semiconductor relay according to claim 2, wherein the impedance element is a resistor.

5. The optical semiconductor relay according to claim 1, wherein an anode electrode of the first diode is connected to an anode end of the first photodiode array.

6. The optical semiconductor relay according to claim 5, wherein the impedance element is a resistor.

7. The optical semiconductor relay according to claim 1, wherein the impedance element is a resistor.

* * * * *